United States Patent
Sonsky et al.

(10) Patent No.: US 8,373,227 B2
(45) Date of Patent: Feb. 12, 2013

(54) SEMICONDUCTOR DEVICE AND METHOD HAVING TRENCHES IN A DRAIN EXTENSION REGION

(75) Inventors: Jan Sonsky, Leuven (BE); Anco Heringa, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/124,219

(22) PCT Filed: Oct. 6, 2009

(86) PCT No.: PCT/IB2009/054360
§ 371 (c)(1),
(2), (4) Date: May 3, 2011

(87) PCT Pub. No.: WO2010/046794
PCT Pub. Date: Apr. 29, 2010

(65) Prior Publication Data
US 2011/0198691 A1    Aug. 18, 2011

(30) Foreign Application Priority Data

Oct. 20, 2008  (EP) ..................................... 08105606
Oct. 6, 2009   (WO) .................. PCT/IB2009/054360

(51) Int. Cl.
*H01L 29/66* (2006.01)
*H01L 21/76* (2006.01)

(52) U.S. Cl. ......... 257/337; 257/339; 257/335; 438/424

(58) Field of Classification Search ............ 257/335, 257/337, 339, 401, E21.417, E21.418, E21.42, 257/E21.619; 438/286, 289
See application file for complete search history.

(56) References Cited

U.S. PATENT DOCUMENTS

| 6,025,237 | A  | * | 2/2000  | Choi ............................. 438/301 |
| 7,795,100 | B2 | * | 9/2010  | Ema et al. ..................... 438/301 |
| 2008/0093667 | A1 | * | 4/2008  | Shibib et al. .................. 257/341 |
| 2008/0268588 | A1 | * | 10/2008 | Anderson et al. ............. 438/218 |

FOREIGN PATENT DOCUMENTS

| EP | 519 741 A2 | 12/1992 |
| JP | 04 307971 A | 10/1992 |
| JP | 04307971 | * 10/1992 |
| WO | 2006/136979 A2 | 12/2006 |
| WO | WO 2006/136979 | * 12/2006 |
| WO | 2010/046795 A1 | 4/2010 |

OTHER PUBLICATIONS

Ludikhuize, A., "Kirk Effect Limitations in High Voltage ICs"; ISPSD' 94; pp. 249-252 (1994).
International Search Report and Written Opinion for Application PCT/IB2009/054360 (Feb. 16, 2010).

* cited by examiner

*Primary Examiner* — Julio J Maldonado
*Assistant Examiner* — Harpreet Singh

(57) ABSTRACT

A semiconductor device comprises a substrate including a first region and a second region of a first conductivity type and a third region between the first and second regions of a second conductivity type opposite to the first conductivity type, and being covered by a dielectric layer. A plurality of trenches laterally extend between the third and second region, are filled with an insulating material, and are separated by active stripes with a doping profile having a depth not exceeding the depth of the trenches wherein each trench terminates before reaching the dielectric layer and is separated from the third region by a substrate portion such that the respective boundaries between the substrate portions and the trenches are not covered by the dielectric layer. A method for manufacturing such a semiconductor device is also disclosed.

11 Claims, 5 Drawing Sheets

SEMICONDUCTOR DEVICE AND METHOD HAVING TRENCHES IN A DRAIN EXTENSION REGION

FIELD OF THE INVENTION

Figure 1:
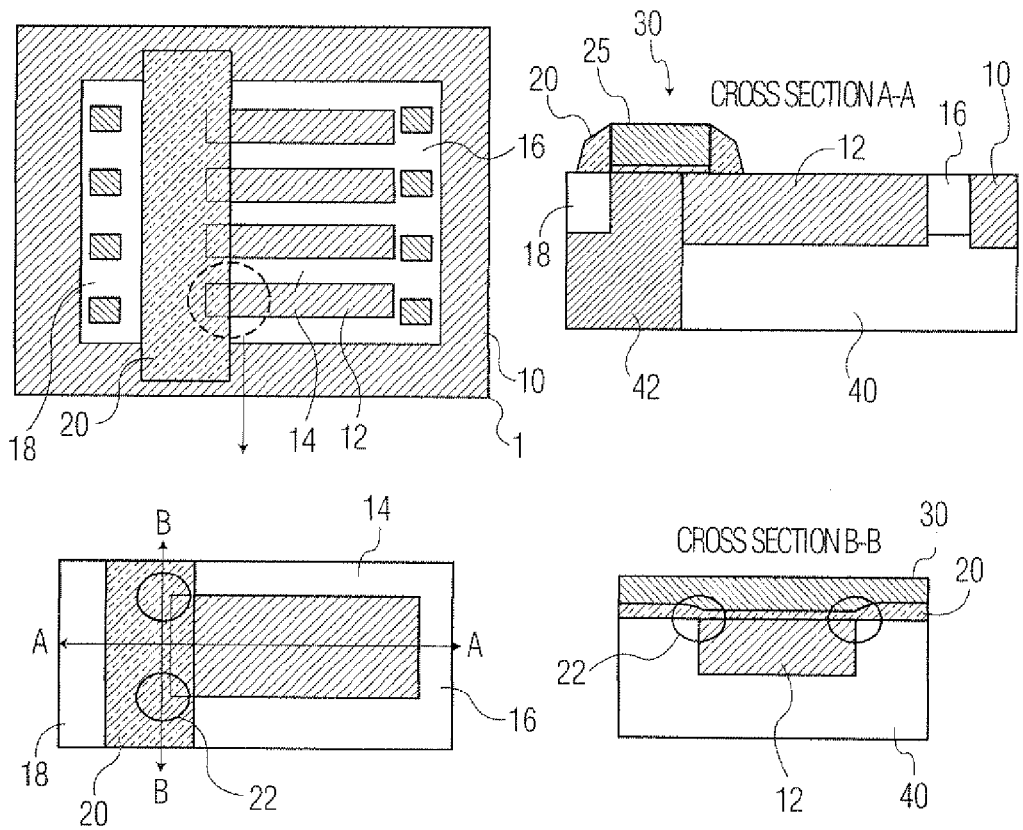

The present invention relates to a semiconductor device comprising a substrate including a first region and a second region doped with a dopant of a first conductivity type and a third region between the first region and the second region doped with a dopant of a type opposite to the first conductivity type, the third region being covered by a dielectric layer, the substrate further comprising a plurality of trenches laterally extending between the first region and the second region, said trenches being filled with an insulating material and having a predetermined depth, and being separated by active stripes comprising a doping profile having a depth not exceeding the predetermined depth.

The present invention further relates to a method of manufacturing such a semiconductor device.

BACKGROUND OF THE INVENTION

In semiconductor devices including p-n junctions, including for example simple diodes as well as more complex devices such as field effect transistors, bipolar transistors or thyristors, high doping levels reduce the series resistance. However, on the other hand, low doping levels allow high reverse voltages to be applied. There is a trade-off between these quantities, and the maximum achievable trade off for a simple diode is known as the 1D silicon limit.

A number of structures are known that can deliver better results than the 1D limit. Such structures are typically known as reduced surface field (RESURF) structures. Junction shaping, or field shaping, using field plates or semi-insulating films can be used.

An alternative approach bridges the junction using dielectric layers—EP 519 741 A2 is an example of this technique. However, these approaches all significantly add to the complexity of the manufacturing process and in particular they are not generally compatible with standard processes since they require additional mask and processing steps not present in the standard processes. There is a significant cost in adding such additional process steps.

A method for manufacturing such a RESURF device in a simplified manner has been disclosed in PCT patent publication WO2006/136979, which discloses a method of manufacturing a semiconductor device according to the opening paragraph. It has been found that although this method allows for a semiconductor device to be manufactured using standard processes, some embodiments of the semiconductor device disclosed in this publication can suffer from a limited gate dielectric lifetime depending on the manufacturing quality and process control, which manifests itself by a time-dependent dielectric breakdown (TDDB) of the gate oxide layer. The reduced robustness to process variations may also restrict product transfer and sourcing to different CMOS foundries.

SUMMARY OF THE INVENTION

The present invention seeks to provide a semiconductor device according to the opening paragraph with an improved gate dielectric lifetime.

The present invention further seeks to provide a method of manufacturing such a semiconductor device.

According to an aspect of the present invention, there is provided a semiconductor device comprising a substrate including a first region and a second region doped with a dopant of a first conductivity type and a third region between the first region and the second region doped with a dopant of a type opposite to the first conductivity type, the third region being covered by a dielectric layer, the substrate further comprising a plurality of trenches laterally extending between the second region and the third region, said trenches being filled with an insulating material and having a predetermined depth, and being separated by active stripes comprising a doping profile having a depth not exceeding the predetermined depth, wherein each trench is separated from the third region by a substrate portion such that the respective boundaries between the substrate portions and the trenches are not covered by the gate dielectric layer.

The present invention is based on the realization that the reduction of the oxide layer lifetime in some of the semiconductor devices of WO2006/136979 can be caused by the overlap between the gate dielectric and the corners of the lateral shallow trenches between the source region and drain region of these devices due to a thinning in the gate dielectric layer over these corners. Although in some of the devices of WO2006/136979 this problem has been avoided by extending the shallow trenches through the third region such as a channel region into the first region such as the source region, these devices suffer from a lower current drive, which means that the footprint of these devices must be increased to meet their performance requirements, which is also unwanted, and in fact limits the applicability of these devices to specific application domains only.

In accordance with the present invention, the termination of the shallow trenches before the third region such as a channel region such that the dielectric, e.g. a gate dielectric, does not overlap with the trench corners ensures that TDDB effects are largely avoided without suffering the penalty of a lower current drive of these devices. The dielectric may be a gate oxide or another suitable dielectric suitable for providing an electrically insulating layer between the third region and a control terminal such as a gate.

In an embodiment, the distance between the third region and said boundaries does not exceed the width of an active stripe, which ensures that the performance of the semiconductor device is not compromised, and in fact even can improve, by the presence of a substrate portion between the p-n junction of the third region and the active stripes on the one side and the shallow trenches on the other side.

Preferably, the width of the active stripe does not exceed the 1-D depletion width at breakdown voltage for the doping concentration of the doping profile to ensure that the semiconductor device can operate beyond the previously explained 1D limit.

In a further embodiment, the dielectric comprises a void separating a first layer region across the third region from a second layer region across the trenches and active stripes, said void overlapping the boundaries between the respective substrate portions and said trenches. This has the advantage that the control over the distance from the third region to the trench is less critical in terms of device performance because the high electric field is shifted away from the control terminal formed over the third region, e.g. a gate or a base terminal, towards a dummy control terminal comprising the second layer portion by the dummy control terminal potential. In addition, the dummy effect drives the current through the device to a greater depth, thus making the device more reliable because the number of hot carriers injected into the dielectric is reduced.

In an embodiment, the active stripes are tapered. This causes the active stripes to behave like an active region comprising a graded doping profile. The narrow ends of the tapered active stripes may be facing the third region.

The semiconductor device of the present invention may be incorporated in an integrated circuit (IC). Such an IC benefits from the relatively small footprints of the semiconductor devices of the present invention, such that a high voltage portion of the IC can be realized whilst requiring limited silicon area, thus limiting the overall size and cost of the IC. Non-limiting examples of suitable applications include dc-dc converters, power management units and display drivers.

According to another aspect of the present invention, there is provided a method of manufacturing a semiconductor device, comprising respectively forming a first region and a second region doped with a dopant of a first conductivity type and a third region doped with a dopant of a type opposite to first conductivity type in between the first region and the second region in a substrate; forming a plurality of laterally extending trenches in the substrate, said trenches having a predefined depth and defining a plurality of active stripes in between said trenches, said trenches being separated from the third region by a substrate portion; filling said trenches with an insulating material; forming respective doping profiles in said active stripes, each doping profile having a depth not exceeding the predefined depth; and forming a dielectric layer over the third region such that the respective boundaries between the substrate portions and the trenches are not covered by the dielectric.

The steps of the method of the present invention, which may be executed in any suitable order, ensure that a semiconductor device of the present invention may be obtained in a standard IC process using the same single mask step which is used already to form the STI trenches. It is pointed out that the formation of STI trenches is commonplace in any modern CMOS technology).

In an embodiment, the step of forming a dielectric layer comprises forming a dielectric layer comprising a void covering the boundary between the substrate portions and the trenches, said void separating a first layer region across the third region from a second layer region across the trenches and active stripes. This step may also be executed using the same mask already used to form the control terminal regions.

BRIEF DESCRIPTION OF THE EMBODIMENTS

Figure 2:
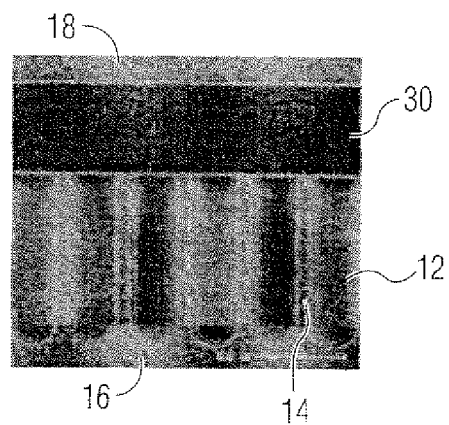
Figure 3:
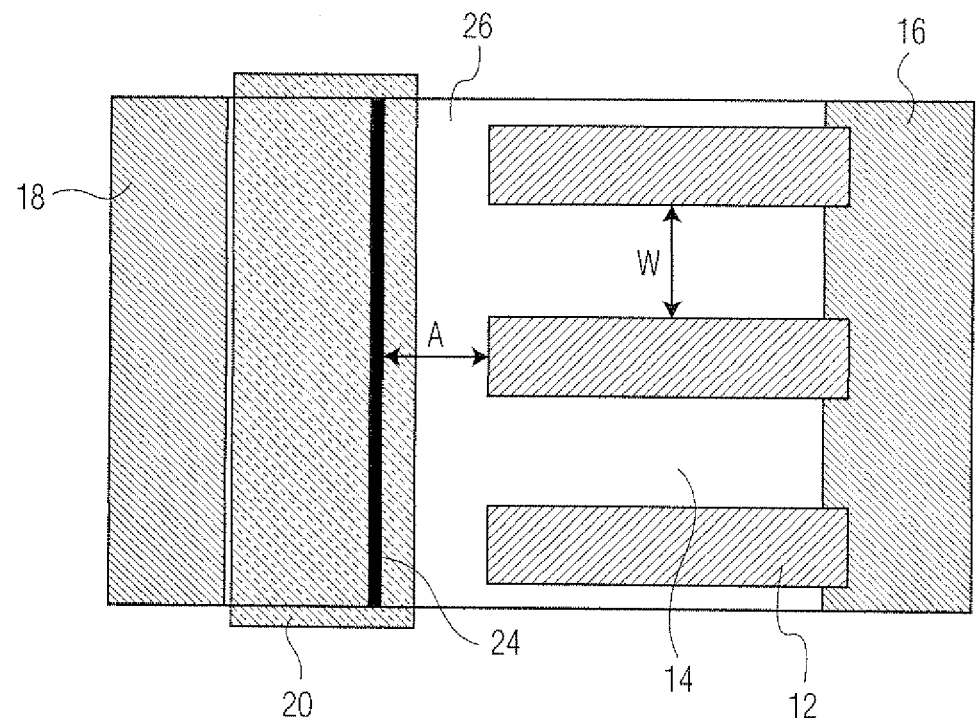
Figure 4:
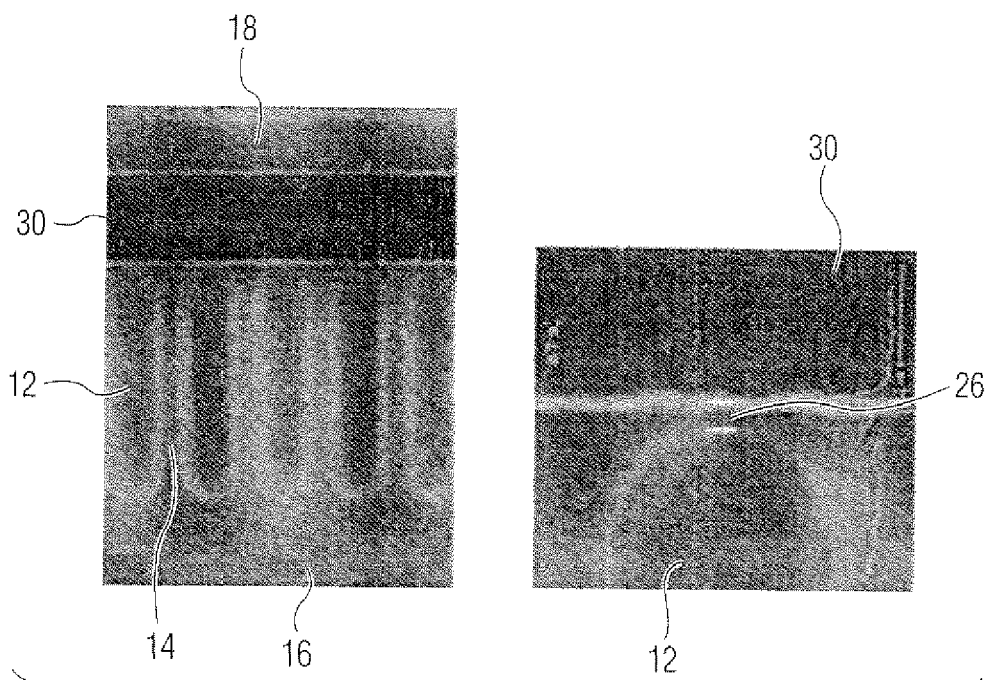
Figure 5:
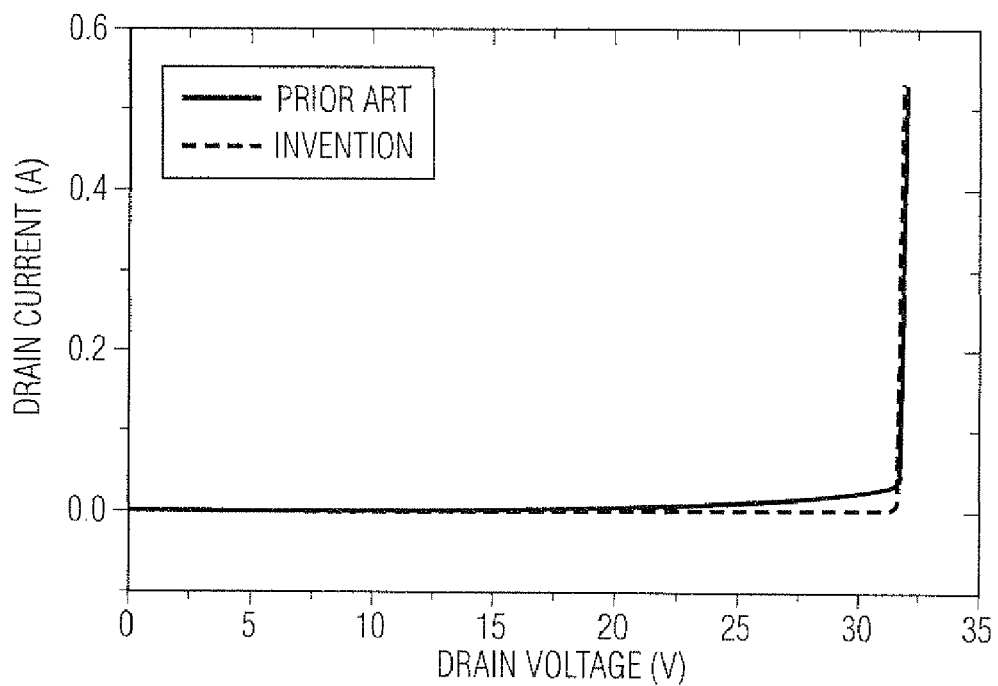
Figure 6:
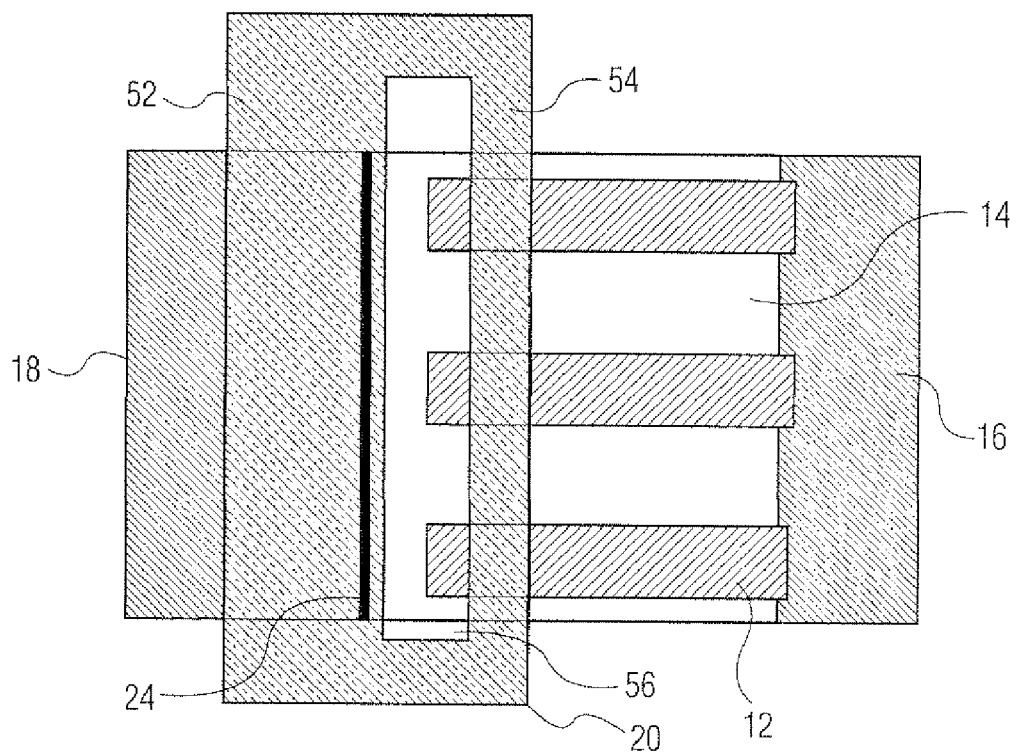
Figure 7:
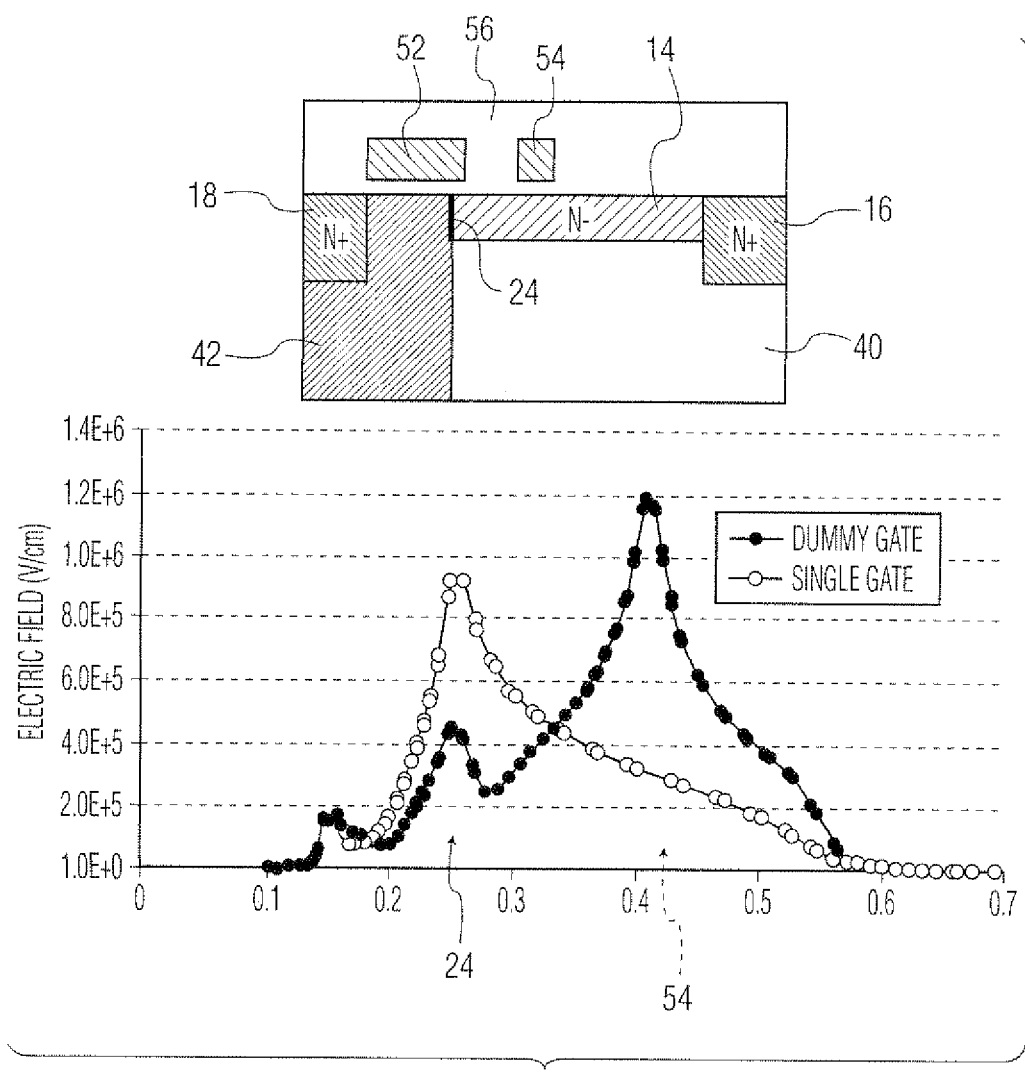
Figure 8:
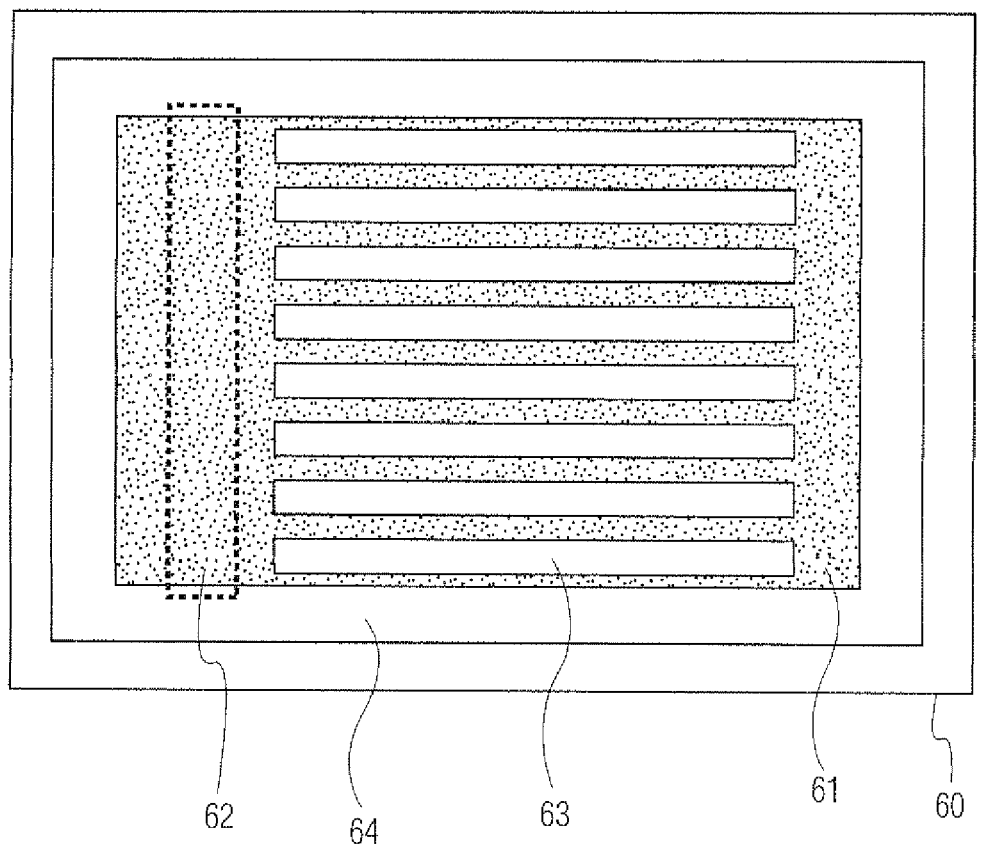

Embodiments of the invention are described in more detail and by way of non-limiting examples with reference to the accompanying drawings, wherein FIG. 1 schematically depicts a prior art semiconductor device;

FIG. 2 schematically depicts a detail of the prior art semiconductor device;

FIG. 3 schematically depicts a semiconductor device in accordance with an embodiment of the present invention;

FIG. 4 schematically depicts a detail of the semiconductor device in accordance with an embodiment of the present invention;

FIG. 5 schematically depicts the off-state characteristics of the prior art semiconductor device and a semiconductor device of the present invention;

FIG. 6 schematically depicts a semiconductor device in accordance with another embodiment of the present invention;

FIG. 7 schematically depicts an electrical field profile of the prior art semiconductor device and a semiconductor device of the present invention; and FIG. 8 schematically depicts a mask for use in an embodiment of the method of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

FIG. 1 depicts various views of a MOSFET 1 disclosed in WO 2006/136979. The device comprises an active region bordered by a shallow insulation trench 10. The active region comprises a n-type drain region 16, a n-type source region 18 and a channel region formed in a p-well 42 of the substrate 40. The active region further comprises active stripes 14 separated by shallow trenches 12.

The shallow trenches 12 extend laterally between the source region 18 and the drain region 16 into the channel region, such that the end portions of the shallow trenches 12 are covered by the gate oxide 20, which forms an insulating layer between the channel region and a conductive portion 25 of a gate 30. The active stripes 14 are doped with an n-type dopant, such that the active stripes 14 act as drift regions or drain extensions of the drain region 16. Consequently, the corners of the end portions of the shallow trenches 12 overlap with the gate dielectric 20, as indicated by circles 22. As can be seen in the view along the line B-B, a thinning of the gate dielectric 20 occurs in STI corners under the gate overlap, in particular when the gate dielectric is a gate oxide such as silicon oxide. This thinning increases the risk of the occurrence of TDDB effects, as previously explained.

FIG. 2 is a scanning electron microscope (SEM) image of the MOSFET of FIG. 1. The overlap between the shallow trenches 12 filled with an insulating material and the gate 30 is clearly visible from this image.

FIG. 3 schematically depicts an embodiment of a semiconductor device of the present invention. Compared to the semiconductor device of FIG. 1, the lateral shallow trenches 12 terminate before they reach the gate dielectric 20, such that the shallow trenches are separated by a distance A from the p-n junction 24 formed by the p-well 42 and the doping implants in the drain extension region including the active stripes 14 and the silicon portions 26 between the p-n junction 24 and the shallow trenches 12. It will be appreciated that the silicon portions 26 may also comprise the doping profile also present in the active stripes 14. In other words, the semiconductor device may comprise a drain extension region between the drain region 16 and the channel region, with at least one end of the shallow trenches 12 terminating within the drain extension region.

By avoiding an overlap of the gate dielectric 20 with the corners of the shallow trenches 12, thinning of the gate dielectric 20 such as a gate oxide is avoided, thereby ensuring that the semiconductor device has excellent TDDB lifetime.

In a preferred embodiment, the distance A does not exceed the width W of the active stripes 14. More preferably, the active width W does not exceed the 1D depletion layer width (=1D) at breakdown voltage for a given doping profile as determined in a structure without STI trenches, such that $A \leq W \leq 1D$. Under these conditions, it is ensured that the area between the gate and STI trenches 12 carries a sufficiently small amount of charge so that the area can be depleted before breakdown occurs. The total amount of charge present in this area is determined by the doping concentration profile times the distance A.

Hence, if this relationship is obeyed in the layout of the semiconductor device of the present invention, the semiconductor device is capable of performing beyond the previously explained 1D limit in its resistance/breakdown voltage trade-off because it is guaranteed that the total amount of charge available in the drain extension near the gate 30 can be depleted before a critical electrical field can develop in this location.

In FIG. 3, the semiconductor device of the present invention is shown as a MOSFET transistor by way of non-limiting example only. The present invention may be applied to any gate-controlled semiconductor device, such as gated diodes, bipolar transistors, thyristors and the like.

FIG. 4 shows an SEM image of the semiconductor device of FIG. 3. The termination of the lateral shallow trenches 12 close to the gate 30 such that there is no overlap between the gate 30 including its gate dielectric 20 and the end portions, i.e. corners, of the shallow trenches is immediately apparent, especially in the magnified portion of the image where the substrate portion 26 between a shallow trench 12 and the gate 30 can be recognized.

FIG. 5 depicts a comparison of the breakdown voltage in the prior art DIELER transistor of FIG. 1 and the DIELER transistor of FIG. 3. As can be seen from FIG. 5, the modifications of the present invention have no detrimental effect on the breakdown voltage of the DIELER transistor and in fact are capable of improving the behavior of this transistor.

In an alternative embodiment of the semiconductor device of the present invention, which is schematically depicted in FIG. 6, the gate dielectric 20 comprises a void 56 separating a first gate dielectric region 52 from a second gate dielectric region 54 such that the boundary between the shallow trenches 12 and the substrate portions 26 are positioned under the void 56. The first gate dielectric portion 52 acts as a dielectric for the gate 30 whereas the second dielectric portion 54 acts as the dielectric for a dummy gate extending over the shallow regions 12 and the active stripes 14.

This embodiment has a number of advantages over the prior art. First of all, due to the fact that the shallow trenches 12 terminate under the void 56, there is no overlap between the trench corners and the gate dielectric region 52, such that the gate 30 including the gate dielectric region 52 does not suffer from an increased risk of TDDB effect caused by the thinning of the gate dielectric, e.g. gate oxide, under the gate conductor 25. In addition, the presence of the dummy gate relaxes the required alignment accuracy between the p-well 42 and the edges of the shallow trenches 12 facing the p-well 42, which makes this embodiment better suitable for less advanced semiconductor technologies, e.g. CMOS technologies.

Secondly, the threshold voltage ($V_T$) of this device is comparable to the $V_T$ of regular CMOS transistors. In addition, the dummy gate forces the current flow near the gate 30 deeper into the substrate, and causes the electrical field near the gate 30 to be reduced compared to a single gate device. This has the advantage that the risk of hot carrier injection (HCI) into the gate dielectric region 52 is reduced.

This is further demonstrated in FIG. 7, in which the electrical field generated in the semiconductor device of FIG. 6 (light line) is compared with the electrical field generated in a single gate device (dark line). The solid arrow in FIG. 7 indicates the location of the p-n junction 24. in these devices, from which it is immediately apparent that the electrical field in the semiconductor device of FIG. 6 is substantially smaller than in a single gate device, thus providing clear evidence of the better HCI reliability of the device of the present invention. The dashed arrow in FIG. 7 indicates the peak in the electrical field experienced by the semiconductor device of FIG. 6, which caused by the potential of the dummy gate over the shallow trenches 12 and active stripes 14.

An advantage of the present invention is that the manufacturing of the semiconductor devices of the present invention may be achieved by a method of the present invention that is compatible with conventional manufacturing processes, thus maintaining the benefits of the method described in WO 2006/136979.

To form the trenches 10, a shallow trench isolation (STI) mask 60 as shown in FIG. 8 is used to provide a pattern. Solid region 61 of the mask defines an active region of the finished device, which includes the source region 18, the drain region 16, the drain extensions in the active stripes 12 and the channel region. The solid region 61 is surrounded by pattern elements 64 which are openings that define the location of the shallow trench 10 around the active region. Pattern elements 63 are openings that define the locations of the shallow trenches 12 between the active stripes 14 in the finished device. The location of the gate dielectric 20 over the channel region in the finished device is indicated by dashed box 62, thus clearly showing that the gate dielectric 20 and the shallow trenches 12 do not overlap. The gate dielectric 20 is formed over the channel region following the formation of the shallow trenches 12 and the various doping profiles in the substrate 40.

The presence of the pattern elements 64 and the pattern elements 63 in a single mask 60 means that the STI patterning step, which is standard in most foundry IC processes and in Philips/NXP processes of the generations of 0.25 micron and beyond and in the Crolles2 Alliance 180, 120, 90, 65 and 45 nm CMOS processes, can be used to form both a shallow trench isolation 10 around the active region 19 and also the laterally extending trenches 12. After forming the trenches 10 and 12, processing continues using the standard process to complete the device.

As has been explained in WO 2006/136979 STI trenches are normally used to separate different semiconductor devices from each other. However, as taught by WO 2006/136979 and the present invention, shallow trenches 12 are used for a different purpose, namely to dilute the doping profile in an active region such as a drain extension region of a MOSFET, as well as to shape the electric field. By using the shallow threshold adjustment implant of the standard process for a very different purpose, to form the n-type drain extension regions in the active stripes 14, the p-n junction 24 depth only extends to the depth of this drain extension region so that shallow trenches 12 are sufficiently deep to successfully isolate neighboring drain extension regions from one another.

The p-type region 42 is manufactured using the standard mask and implant step normally used to implant the p-well. The n-type region 14 must be manufactured using steps with a relatively shallow implantation depth, e.g. with a depth of about 200 nm. Contact regions of the source region 18 and the drain region 16 may be implanted using the standard steps used to implant contact regions. The p-type region 42 is a channel region, and the n-type regions formed by the active stripes 14 are a drift region normally thought of as part of an extended drain 16, which may comprise one or more n+ type drain contacts. A gate 30 comprising a conductive layer 25, e.g. metal, silicide or poly-Si separated from the channel region by a gate dielectric 20, is provided over the channel region 42. The gate dielectric 20 may be a gate oxide or another suitable material, e.g. a high-k dielectric material.

Further, those skilled in the art will appreciate that many modifications to the processes described in the specific embodiment are possible.

For example, it is not necessary to fill the shallow trenches with oxide, or oxide alone, and other materials such as silicon nitride, or low doped (preferably undoped) polysilicon may be used. Such materials may have a lower or a higher dielectric constant k than silicon dioxide (k=3.9 for silicon dioxide, 7.5 for silicon nitride, and 11.7 for low doped polysilicon). Accordingly, in such an arrangement, the oxide filling some of the trenches of the embodiments above is replaced by a material having a dielectric constant of at least 4, preferably at least 7. In such case, only the laterally extending trenches 12 are filled with the dielectric material having a different dielectric constant, while the shallow trenches 10 are filled with the standard insulator.

The substrate 40 used need not be silicon and alternatives such as gallium arsenide, indium phosphide, gallium nitride and many others may also be used. The substrate can also be silicon-on-insulator wafer with SOI thickness both smaller or greater than STI trenches.

Although the embodiments of the semiconductor device of the present invention use a p-type channel region and n-type source and drain, it will be appreciated that the invention is just as applicable to a transistor using an n-type channel, and/or p-type sources and drains.

It is further emphasized that the active stripes 14 have been shown to have a rectangular shape by way of non-limiting example only. Other embodiments, for instance as shown in FIG. 13 of WO 2006/136979, in which the active stripes 14 have a tapered shape are also feasible. In such an arrangement, the active stripes 14 may be arranged to be narrow at the end near the gate 30 and wider near the drain region 16. This effectively amounts to graded doping across the extended drain region which further improves the trade-off between breakdown voltage and on-resistance.

The semiconductor body can be a single crystal, a single crystal with an epilayer formed on top, or other technologies such as silicon on insulator, silicon on sapphire etc may also be used.

Although the description and claims use the term "pn junction", this is intended to include "p-i-n junctions" in which p-type material is separated from n-type material by intrinsic material or lowly p- or n-type doped material. In such cases, the p-n junction and its depth are as defined by the whole p-i-n structure.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A semiconductor device comprising a substrate including
   a first region;
   a second region doped with a dopant of a first conductivity type;
   a third region, between the first region and the second region, doped with a dopant of a second conductivity type opposite to the first conductivity type and covered by a dielectric layer; and
   a plurality of trenches laterally extending between the third region and the second region, filled with an insulating material, having a predetermined depth, and separated by active stripes with a doping profile having a depth not exceeding the predetermined depth, wherein each trench is separated from the third region by a substrate portion such that respective boundaries between the substrate portions and the plurality of trenches are not covered by the dielectric layer, and a distance between the third region and said boundaries does not exceed a width of an active stripe.

2. The semiconductor device of claim 1, wherein the first region comprises a source region, the second region comprises a drain region, the third region comprises a channel region, and the active stripes and the respective substrate portions collectively form a drain extension region between the channel region and the drain region.

3. The semiconductor device of claim 1, wherein the width of the active stripe does not exceed the 1-D depletion width for the doping concentration of the doping profile of said active stripe.

4. The semiconductor device of claim 1, wherein the dielectric layer comprises a void separating a first layer region across the third region from a second layer region across the trenches and active stripes, said void overlapping the boundaries between the respective substrate portions and said trenches.

5. The semiconductor device of claim 1, wherein the active stripes are tapered.

6. An integrated circuit comprising the semiconductor device according to claim 1.

7. A method of manufacturing a semiconductor device, the method comprising:
   respectively forming a first region and a second region doped with a dopant of a first conductivity type, and a third region in a substrate, the third region being located between the first region and the second region and being doped with a dopant of a second conductivity type opposite to the first conductivity type;
   forming a plurality of laterally extending trenches between the third region and the second region in the substrate, said laterally extending trenches having a predefined depth and defining a plurality of active stripes in between said laterally extending trenches, each of said laterally extending trenches being separated from the channel region by a substrate portion;
   filling said laterally extending trenches with an insulating material;
   forming respective doping profiles in said active stripes, each doping profile having a depth not exceeding the predefined depth; and
   forming a dielectric layer over the third doped region such that the respective boundaries between the substrate portions and the laterally extending trenches are not covered by the dielectric layer, wherein the distance between the third doped region and a laterally extending trench does not exceed the width of an active stripe.

8. The method of claim 7, wherein the width of an active stripe does not exceed the 1-D depletion width of the doping profile therein.

9. The method of claim 7, wherein the step of forming a dielectric layer comprises:

forming a dielectric layer comprising a void covering the respective boundaries between the substrate portions and the trenches, said void separating a first layer region across the third doped region from a second layer region across the trenches and active stripes.

10. The method of claim 9, wherein the first layer region is disconnected from the second layer region.

11. The method of claim 7, wherein said active stripes are tapered.

* * * * *